(12) United States Patent
Heinrich

(10) Patent No.: US 6,323,695 B1
(45) Date of Patent: Nov. 27, 2001

(54) COMPARATOR WITH CONTROLLABLE BIAS CURRENT SOURCE

(75) Inventor: Peter Heinrich, Edling (DE)

(73) Assignee: STMicroelectronics GmbH, Grasbrunn (DE)

(*) Notice: Subject to any disclaimer, the term of this patent is extended or adjusted under 35 U.S.C. 154(b) by 0 days.

(21) Appl. No.: 09/393,127

(22) Filed: Sep. 10, 1999

(30) Foreign Application Priority Data

Sep. 11, 1998 (DE) .............................. 198 41 718

(51) Int. Cl.⁷ ...................................... H03K 5/22
(52) U.S. Cl. ................................. 327/89; 327/77
(58) Field of Search .................... 327/77, 87, 89, 327/65, 66, 52, 53, 560, 561, 562, 563, 78, 56, 74; 330/253, 257, 261

(56) References Cited

U.S. PATENT DOCUMENTS

| | | | |
|---|---|---|---|
| 4,384,219 | 5/1983 | Davis | 327/80 |
| 4,442,408 | 4/1984 | Le | 330/261 |
| 4,529,891 | 7/1985 | Oida | 327/77 |
| 4,712,021 | 12/1987 | Grollinger | 327/66 |
| 5,148,119 | 9/1992 | Wright et al. | 330/259 |
| 5,343,086 * | 8/1994 | Fung et al. | 327/63 |
| 5,469,092 | 11/1995 | Itakura | 327/103 |
| 5,543,976 | 8/1996 | Dayton et al. | 360/46 |
| 5,548,227 * | 8/1996 | Minami | 327/74 |
| 5,796,281 * | 8/1998 | Saeki et al. | 327/53 |
| 5,945,852 * | 8/1999 | Kosiec | 327/77 |
| 6,121,838 * | 9/2000 | Freeman et al. | 330/253 |

FOREIGN PATENT DOCUMENTS

| | | |
|---|---|---|
| 0 468 760 A | 1/1992 | (EP) . |
| 0472340A1 * | 2/1992 | (EP) .............. H03F/1/32 |

* cited by examiner

Primary Examiner—Timothy P. Callahan
Assistant Examiner—Linh Nguyen
(74) Attorney, Agent, or Firm—E. Russell Tarleton; SEED IP Law Group, PLLC

(57) ABSTRACT

A comparator having a differential amplifier with a signal input to receive an input signal and a reference input to receive a reference voltage, and having a controllable bias current source for supplying to the differential amplifier a bias current that has a low quiescent current or a higher active current as a function of whether the input signal is constant or variable. The controllable bias current source is further configured to adjust the bias current in accordance with the rate of change of the input signal.

19 Claims, 2 Drawing Sheets

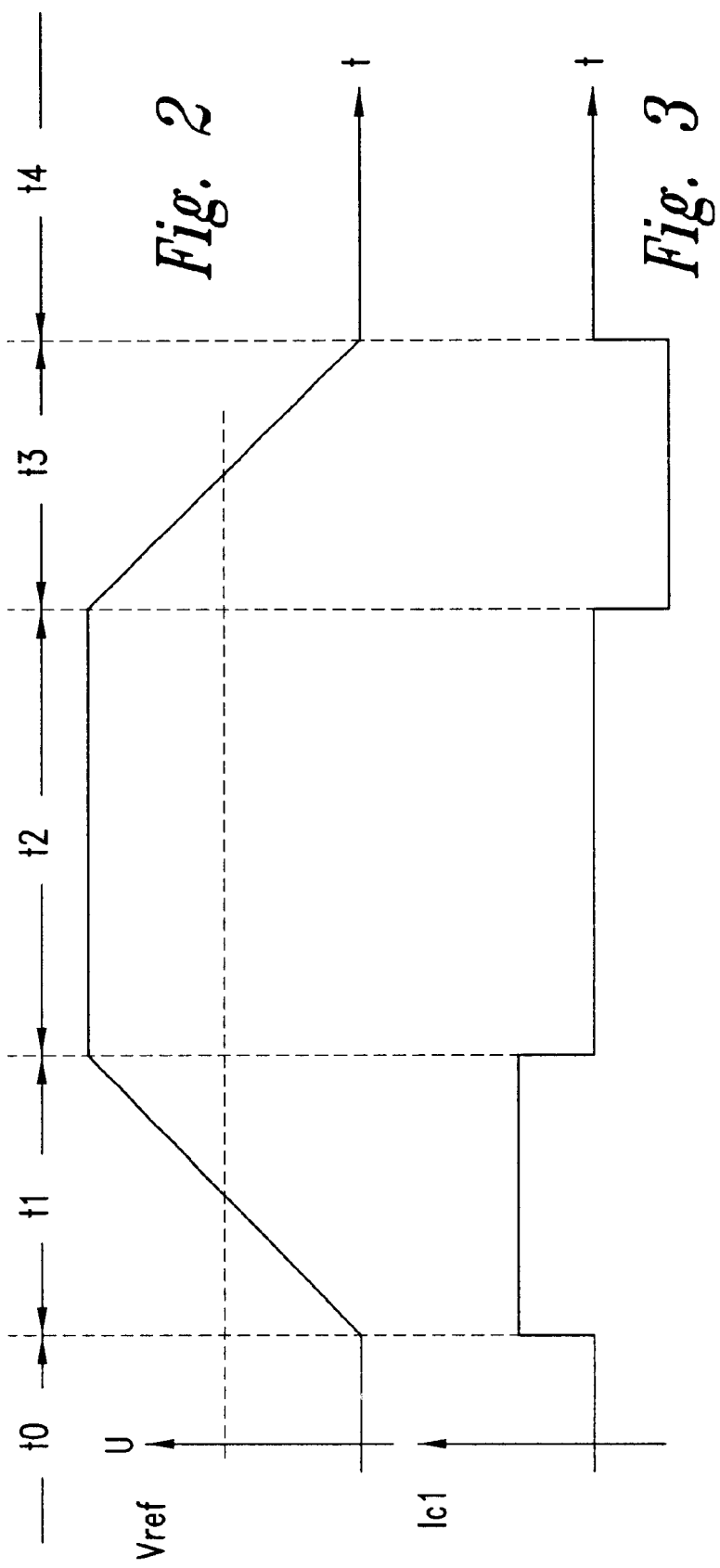

COMPARATOR WITH CONTROLLABLE BIAS CURRENT SOURCE

TECHNICAL FIELD

This invention relates to a comparator having a differential amplifier, a signal input to which an input signal is applied, a reference input to which a reference voltage is applied, and a controllable bias for adjustment of a predetermined operating point of the differential amplifier.

BACKGROUND OF THE INVENTION

Examples of comparators are shown in U.S. Pat. Nos. 4,384,219 and 4,529,891. In both cases a differential amplifier stage with two transistors is connected on the high potential side via a constant current source with a supply voltage source and on the low potential side via a current mirror with a ground lead.

The speed of a comparator is known to be higher the greater the bias current. That is, the speed at which an effect occurs at the comparator output when the input signal thereof passes through the comparator threshold depends on the strength of the bias current. From the point of view of the speed of the comparator it would therefore be desirable to supply a bias current with high current strength.

A high bias current leads to accordingly high power consumption, however, which is undesirable, especially when power is supplied from a battery. Conventionally, one must therefore make a compromise between a tolerable power consumption and a tolerable speed of the comparator. The invention addresses the problem of providing a comparator which is not subject to this compromise but permits both high speed and low power consumption.

SUMMARY OF THE INVENTION

The embodiments disclosed herein provide a comparator that has a controllable bias current source for supplying a bias current having a low quiescent current strength or a higher active current strength as a function of whether the input signal is constant or variable at the moment.

In very many applications, in particular in the digital area, speed of the comparator is only required during times when the input signal varies, while in the times therebetween when the input signal remains constant the comparator can be indefinitely slow. During the times of a constant input signal a very low bias current is thus required and supplied according to the invention. During times of a varying input signal when speed of the comparator is important, the bias current is increased in order to ensure the speed of the comparator then desired. In the disclosed embodiments, a high bias current only flows during times of a varying input signal, while a very low bias current flows during the remaining times of a constant input signal, which are generally greatly predominant. Thus, the invention achieves a relatively low mean power consumption while nevertheless ensuring a high speed of the comparator at the crucial times.

In one embodiment of the invention, the controllable bias current source contains two current sources whose sum current is supplied to the differential amplifier as the bias current. One of said current sources is a constant current source which supplies a very low quiescent current, preferably in the range of a few microamperes. The other current source is an additional current source which supplies an additional current only during those times when the input signal varies.

Considering as an input signal, for example, a digital signal which changes between a constant low potential and a constant high potential, the transitions between low potential and high potential being formed by leading or trailing edges with a certain edge slope, the additional current source supplies an additional bias current only during the times of leading and trailing edges, while the additional bias current is zero between the edges, ie., during the time segments of constant low or constant high potential, and only the quiescent current from the constant current source is supplied as the bias current during such times. During the signal edges the comparator is fast by reason of the additional bias current, while it is slow, and only needs to be slow, during the time segments of constant potential.

In another disclosed embodiment, the level of the additional current is made dependent on the rate of the input signal variation during times when the input signal varies. This causes the comparator to be faster the steeper the input signal variation is. The speed of the comparator is thus adapted to the need for speed. If at very high speed in the comparator is required upon very fast or very steep input signal variation, it is given the necessary high bias current. However, if the comparator only needs to process less fast or less steep input signal variations, it is supplied a lower additional bias current, which keeps the mean power consumption especially low.

In accordance with one disclosed embodiment, an additional current source with a controllable current source and a capacitor connected between the signal input and a control input of the controllable current source is provided. The input signal is supplied to the capacitor. Designating the capacitor C, the capacitor current Ic, the input signal U and the time t, one obtains a capacitor current $$Ic = dU/dt. \tag{1}$$

Ic is nonzero only when voltage U varies so that dU/dt is nonzero.

In an embodiment of a comparator with a capacitor in the additional current source, it is recommendable to use two current sources, each with a capacitor, for example, a first current source and first capacitor supplying an additional current only during positively directed input signal variations, and a second current source and second capacitor supplying additional current only during negatively directed input signal variations. If one and the same capacitor were used both for positively and for negatively directed input signal variations, it would draw current from the input signal source during input signal variations in one direction in the desired fashion but would have to draw a current from the quiescent current source upon input signal variations in the other direction.

In an embodiment of the invention with additional current source constructed with one or two capacitors, the, or each, controllable current source has a current mirror that is given capacitor current Ic in an input branch and mirrors it to the biasing current terminal of the differential amplifier.

The differential amplifier can be constructed with further current mirrors in a way known in the art.

BRIEF DESCRIPTION OF THE DRAWINGS

FIG. 2 shows an example of an input signal shape; and

FIG. 3 shows an example of a capacitor current of the circuit shown in FIG. 1.

DETAILED DESCRIPTION OF THE INVENTION

Figure 1:
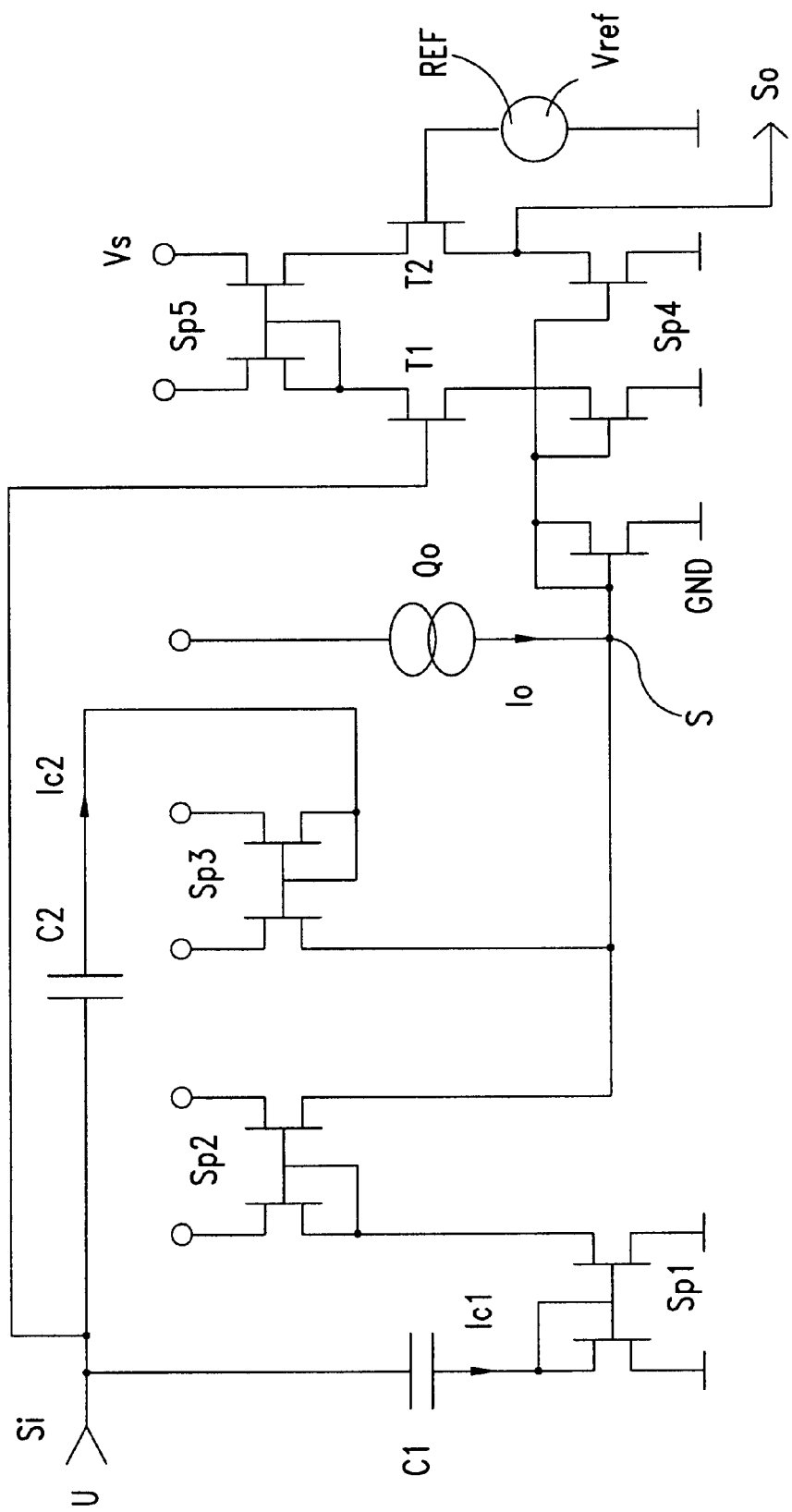
FIG. 1 shows a circuit diagram of an embodiment of an inventive comparator.

FIG. 1 shows a circuit diagram of an embodiment of an inventive comparator with a bias current source comprising a quiescent current source and an additional current source.

In a way known in the art, the comparator shown in FIG. 1 has a differential amplifier stage with two transistors T1 and T2. The gate terminal of said transistor T2 is connected with signal input Si of the comparator, which is supplied with an input signal U. A detail of an example of such an input signal U is shown in FIG. 2. The gate terminal of transistor T2 is connected with reference voltage source REF, which supplies reference voltage Vref to the gate terminal of T2.

All lines in FIG. 1 which end in a circle are connected with high potential side Vs, and all lines in FIG. 1 which end in a crossline are connected with low potential side GND of a supply voltage source.

In the way likewise known in the art, transistors T1 and T2 of the differential amplifier stage are located between high potential side current mirror Sp5 and low potential side current mirror Sp4. Differential amplifier stage T1, T2 and current mirrors Sp4, Sp5 form a differential amplifier. The latter has biasing current terminal S which simultaneously forms a current summing point of the circuit. Connected to S is quiescent current source $Q_0$ which supplies quiescent current $I_0$ constituting a quiescent bias current to bias current terminal S.

Connected to bias current terminal S is furthermore an additional current source which, according to the invention, feeds an additional current into biasing current terminal S only during time segments when input signal U varies. The additional current source comprises two additional current stages. A first additional current stage comprises first capacitor C1, first current mirror Sp1, and second current mirror Sp2. The second additional current stage comprises second capacitor C2 and third current mirror Sp3. Current mirrors Sp1 and Sp3 each form a controllable current source. The control of said current sources is effected with capacitor current Ic1 of first capacitor C1 or with capacitor current Ic2 of second capacitor C2.

All current mirrors Sp1 to Sp5 are constructed in known fashion each with a diode branch in the form of a transistor wired as a diode and a transistor branch, in a known way as shown in FIG. 1, so that no detailed discussion of the structure and effect of such current mirrors is necessary here. In the way likewise known in the art, low potential side current mirror Sp4 of the differential amplifier is constructed with, three current mirror branches. A connecting point between transistor T2 and current: mirror Sp4 forms output terminal So of the comparator.

First additional current stage C1, Sp1, Sp2 serves to feed an additional current into bias current terminal S whenever input signal U is varying in the positive direction or in the direction of increasing potential. Second additional current source C2, Sp3 serves to supply an additional current into bias current terminal S whenever input signal U is varying in the negative direction or in the direction of decreasing potential. Since in both cases the additional current is to be drawn from the signal source providing input signal U and to be supplied into bias current terminal S, the first additional current stage has two series-connected current mirrors Sp1 and Sp2, Sp1 being on the low potential side of the supply voltage source and Sp2 on the high potential side thereof.

The mode of operation of the comparator circuit shown in FIG. 1 will now be explained, assuming input signal U with the signal pattern shown by way of example in FIG. 2.

FIG. 2 shows input signal U having constant low and high potential patterns in time segments t0, t2 and t4 and having a leading edge and a trailing edge in time segments t1 and t3, respectively.

The two capacitors C1 and C2 lead to current $$Ic1 = C1 \cdot dU/dt \tag{2}$$

$$Ic2 = C2 \cdot dU/dt. \tag{3}$$

During time segments t0, t2 and t4, dU/dt=0, while during time segments t1 and t3 dU/dt assumes a positive or negative value. This is shown in FIG. 3 for capacitor current Ic1 of first capacitor C1.

During time segments t0, t2 and t4, which can be termed quiescent. segments, capacitor currents Ic1 and Ic2 are thus both equal to zero Current mirror Sp1 is rendered conductive only by positive capacitor current Ic1 while it blocks negative capacitor current Ic1. Conversely, current mirror Sp3 is rendered conductive only by negative capacitor current Ic2 while it block, positive capacitor current Ic2.

During time segments t0 to t4 the following bias current feed into bias, current terminal S thus takes place.

During time segments t0, t2 and t4 only quiescent current $I_0$ from constant current source $Q_0$ is fed in. During time segment t1, previously charged first capacitor C1 supplies a current corresponding to Ic1 to bias current terminal S via current mirrors Sp1 and Sp2. During time segment t3, previously charged second capacitor C2 supplies a current corresponds to Ic2 to bias current terminal S via current mirror Sp3.

Put in general terms, the inventive bias current source thus works in such a way that the differential amplifier is supplied via bias current terminal S a bias current which has low quiescent current strength $I_0$ or a higher active current strength of about $I_0+Ic1$ or $I_0+Ic2$ as a function of whether input signal U is constant or variable at the moment.

If signal input Si of the comparator is for example a connection to a bus and input signal U is a bus signal that is to be evaluated by means of the comparator according to FIG. 1, the time fractions when edges occur are relatively small on the average, in particular for bus systems having relatively long quiescent times between active times. The invention has realized the goal of achieving very low power consumption of the comparator during such quiescent times, which constitute the greatest time fraction in practical cases. It is virtually irrelevant that higher power consumption occurs during the active bus phases, i.e., at slope times of input signal U, in view of the small mean time fraction of such slopes. The invention thus makes it possible to keep mean power consumption of the comparator very low by reducing quiescent bias current 10 to a few microamperes for example, while nevertheless making the comparator fast during the crucial time segments of input signal edges.

The embodiment of an inventive comparator with capacitors C1 and C2 as shown in FIG. 1 has the additional advantage that capacitor current Ic1 or Ic2 is higher the steeper the particular edge of input signal U is. That is, the steeper the edge the faster the comparator becomes. This is because with increasing edge steepness, bias, current terminal S is supplied accordingly increasing additional current from the additional current source.

In the embodiment of the comparator shown in FIG. 1, all transistor, are formed as MOS transistors. The type of channel which the individual transistors have depends on the polarity of the supply voltage terminals. However, it is also possible to construct a corresponding circuit completely or at least partly with bipolar transistors.

What is claimed is:

1. A comparator, comprising:
   a differential amplifier with a signal input to receive an input signal and a reference input to receive a reference voltage, and
   a controllable bias current source for supplying to the differential amplifier a bias current that has a low quiescent current level or a higher active current level as a function of whether the input signal is constant or variable, respectively, the bias current source comprising a constant current source supplying a constant quiescent current, and an additional current source comprising a controllable current source and a capacitor connected between the signal input and a control input of the controllable bias current source, the additional current source supplying an additional current, the level of which depends on the rate of the input signal variation.

2. The comparator of claim 1 wherein the differential amplifier has a bias current terminal to which an output terminal of the constant current source and art output terminal of the additional current source are connected.

3. The comparator of claim 1 wherein the additional current source comprises:
   a first capacitor and a first controllable current source that supplies an additional current only upon an input signal varying in a positive direction; and
   a second capacitor and a second controllable current source that supplies additional current only upon an input signal varying in a negative direction.

4. The comparator of claim 3 wherein each controllable current source has a current mirror connected between the capacitor and the bias current terminal for mirroring a, capacitor current supplied thereto from the capacitor to the bias current terminal.

5. The comparator of claim 3 wherein the first controllable current source has two series-connected current mirrors, a first current mirror coupled with the first capacitor being disposed on a low potential side of a supply voltage source, and a second current mirror coupled with the bias current terminal on a high potential side thereof, and wherein the second controllable current source has a third current mirror disposed on the high potential, side of the supply voltage source and connected between the second capacitor and the bias current terminal.

6. The comparator of claim 1 wherein the differential amplifier has a differential stage with two differential stage transistors that are connected between a high potential side current mirror and a low potential side current mirror, one of which has as current mirror branch into which a current can be fed that depends on the bias current supplied by the controllable bias current source.

7. A comparator, comprising:
   first and second transistors each having a first terminal connected to a high potential side current mirror, a second terminal connected to a low-potential-side current mirror, the first transistor having a first control terminal coupled to an input signal source, the second transistor having a second control terminal coupled to a reference voltage source;
   a first current source having an output coupled to the low-potential-side current mirror and configured to provide a predetermnined bias current when the input signal is in a steady state; and
   a second and third current sources, each having an input coupled to the input signal source and an output coupled to the low-potential-side current mirror, each of the first and second current sources configured to provide an additional bias current in response to changes in the input signal.

8. The comparator of claim 7 wherein the first and second current sources are configured to provide an additional bias current the level of which depends on the rate of change of the input signal.

9. The comparator of claim 7 wherein the second current source is configured to provide an additional bias current when the input signal changes in a negative direction, and the third current source is configured to supply an additional bias current when the input signal changes in a positive direction.

10. The comparator of claim 8 wherein the second and third current sources each comprise a capacitive element coupled to the input signal source and a current mirror device coupled in series between the capacitive element and the low-potential-side current mirror, the second and third current sources configured to mirror the capacitive currents of their respective capacitive elements.

11. The comparator of claim 10 wherein the current mirror device of the third current source comprises a pair of series-connected current mirrors, the first series-connected current mirror is coupled to a high-potential-side of a supply voltage source and the second series-connected current mirror is coupled to a low-potential-side of a supply voltage source.

12. A method for biasing a comparator, comprising:
   receiving an input signal at a controllable bias current source; and
   supplying a bias current at a predetermined level when the input signal is not changing; and
   supplying a first additional bias current from a second current source when the input signal is changing in a positive direction and supplying a second additional bias current from a third bias current source when the input signal is changing in a negative direction.

13. The method of claim 12 wherein supplying an additional bias current comprises supplying an additional bias current the level of which depends on the rate of change of the input signal.

14. The method of claim 12 wherein supplying a bias current at a predetermined level comprises supplying a bias current at a predetermined low level from a first current source when the input signal is not changing.

15. A comparator, comprising:
   a differential amplifier with a signal input to receive an input signal and a reference input to receive a reference voltage; and
   a controllable bias current source for supplying to the differential amplifier a bias current that has a low quiescent current level or a higher active current level as a function of whether the input signal is constant or variable, the controllable bias current source comprising a constant current source supplying a constant quiescent current, and an additional current source supplying an additional current only during times of input signal variation, the additional current having a level that depends on the rate of the input signal variation, the additional current source comprising a controllable current source and a capacitor connected between the signal input and a control input of the controllable bias current source.

16. The comparator of claim 15 wherein the additional current source comprises:

a first capacitor and a first controllable current source that supplies an additional current only upon an input signal varying in a positive direction; and a second capacitor and a second controllable current source that supplies additional current only upon an input signal varying in a negative direction.

17. The comparator of claim 16 wherein each controllable current source has a current mirror connected between the capacitor and the bias current terminal for mirroring a capacitor current supplied thereto from the capacitor to the bias current terminal.

18. The comparator of claim 16 wherein the first controllable current source has two series-connected current mirrors, a first current mirror coupled with the first capacitor being disposed on a low potential side of a supply voltage source, and a second current mirror coupled with the bias current terminal on a high potential side thereof, and wherein the second controllable current source has a third current mirror disposed on the high potential side of the supply voltage source and connected between the second capacitor and the bias current terminal.

19. A method for biasing a comparator, comprising:

receiving an input signal at a controllable bias current source; and supplying a bias current to a differential amplifier in response to the input signal, the bias current increasing when the input signal is changing, wherein supplying an additional bias current comprises supplying a first additional bias current from a first current source when the input signal is changing in a positive direction and supplying a second additional bias current from a second bias current source when the input signal is changing in a negative direction.

* * * * *

UNITED STATES PATENT AND TRADEMARK OFFICE
CERTIFICATE OF CORRECTION

PATENT NO. : 6,323,695 B1  
DATED : November 27, 2001  
INVENTOR(S) : Peter Heinrich Page 1 of 1

It is certified that error appears in the above-identified patent and that said Letters Patent is hereby corrected as shown below:

<u>Column 5, claim 2,</u>
Lines 21 and 22, "and art output terminal" should read as -- and an output terminal -- in the issued patent.

Signed and Sealed this

Second Day of April, 2002

Attest:

Attesting Officer

JAMES E. ROGAN
Director of the United States Patent and Trademark Office